(12) United States Patent
Zhang et al.

(10) Patent No.: US 11,036,264 B2
(45) Date of Patent: Jun. 15, 2021

(54) ADJUSTABLE CLEARANCE FOR COMPUTING DEVICES

(71) Applicant: HEWLETT-PACKARD DEVELOPMENT COMPANY, L. P., Spring, TX (US)

(72) Inventors: Baosheng Zhang, Spring, TX (US); Derek Kanas, Spring, TX (US); Chan Park, Spring, TX (US); Andrew Elsey, Spring, TX (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 16/649,178

(22) PCT Filed: Dec. 15, 2017

(86) PCT No.: PCT/US2017/066747
§ 371 (c)(1),
(2) Date: Mar. 20, 2020

(87) PCT Pub. No.: WO2019/117953
PCT Pub. Date: Jun. 20, 2019

(65) Prior Publication Data
US 2020/0301486 A1 Sep. 24, 2020

(51) Int. Cl.
*G06F 1/20* (2006.01)
*G06F 1/16* (2006.01)
*H05K 5/02* (2006.01)

(52) U.S. Cl.
CPC ............ *G06F 1/203* (2013.01); *G06F 1/1616* (2013.01); *G06F 1/206* (2013.01); *H05K 5/0213* (2013.01)

(58) Field of Classification Search
CPC ........ G06F 1/203; G06F 1/1616; G06F 1/206; G06F 1/1626; G06F 1/1652; H05K 5/0213; H05K 7/20145; H05K 7/20181; H05K 7/20727; B29C 2045/277; B29C 45/2701; B29C 45/2727
See application file for complete search history.

(56) References Cited

U.S. PATENT DOCUMENTS

| 5,552,960 | A   | * | 9/1996 | Nelson ................... | G06F 1/203 165/104.33 |
| 6,097,595 | A   |   | 8/2000 | Cipolla | |
| 6,212,069 | B1  |   | 4/2001 | Janik | |
| 6,243,261 | B1  |   | 6/2001 | Janik et al. | |
| 7,385,811 | B2  | * | 6/2008 | Kwong ................... | G06F 1/203 361/679.48 |
| 8,520,382 | B2  |   | 8/2013 | Tye et al. | |

(Continued)

OTHER PUBLICATIONS

LapWorks MacFeet Laptop Legs w/3 Elevations, Macbook Feet, Macbook Legs, iBook Feet, iBook Legs, Powerbook Feet, Powerbook Legs, Replacement Macbook Feet, Replacement Macbook Legs, 2013, https://www.amazon.com/dn/B000R21DGG.

*Primary Examiner* — Stephen S Sul
*Assistant Examiner* — Michael A Matey
(74) *Attorney, Agent, or Firm* — HP| Patent Department

(57) ABSTRACT

Examples disclosed herein provide a computing device. One example computing device includes a heat generating component disposed within the computing device, and shape memory material (SMM) that adjusts a clearance below a bottom surface of the computing device according to a temperature of the heat generating component.

16 Claims, 2 Drawing Sheets

(56) References Cited

U.S. PATENT DOCUMENTS

| | | |
|---|---|---|
| 8,717,750 B2 | 5/2014 | Ashcraft et al. |
| 9,400,526 B2* | 7/2016 | Casebolt ............... H05K 5/0234 |
| 2002/0018337 A1* | 2/2002 | Nakamura .............. G06F 1/166 |
| | | 361/697 |
| 2004/0212958 A1* | 10/2004 | Jones ...................... G06F 1/203 |
| | | 361/679.27 |
| 2014/0092544 A1 | 4/2014 | Nishi |
| 2014/0160655 A1* | 6/2014 | Yebka ................. H01M 50/209 |
| | | 361/679.21 |
| 2014/0160668 A1 | 6/2014 | Heymann |
| 2015/0062805 A1* | 3/2015 | Katsumata .......... F28D 15/0275 |
| | | 361/679.49 |
| 2016/0187943 A1* | 6/2016 | Sun ....................... G06F 1/1656 |
| | | 361/679.09 |

* cited by examiner

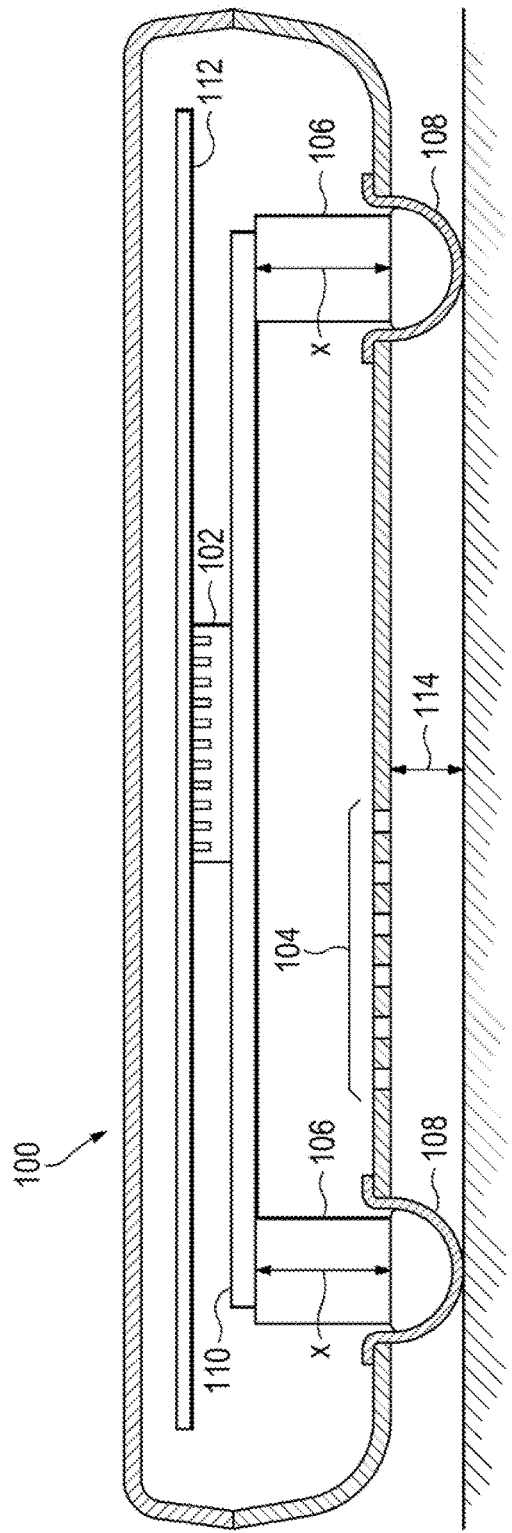
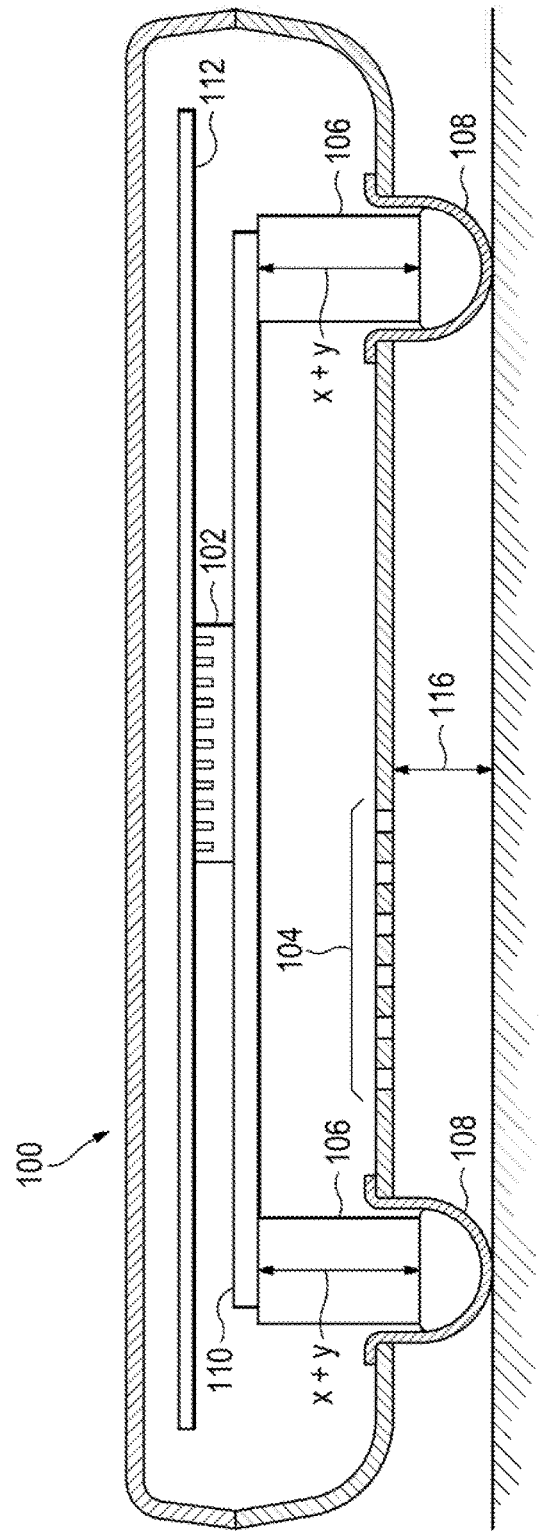

ADJUSTABLE CLEARANCE FOR COMPUTING DEVICES

BACKGROUND

The emergence and popularity of mobile computing has made portable computing devices, due to their compact design and light weight, a staple in today's marketplace. Within the mobile computing realm, notebook computers, or laptops, are one of the more widely used devices and generally employ a clamshell-type design consisting of two members connected together at a common end via hinges, for example. In most cases, a first or display member is utilized to provide a viewable display to a user while a second or base member includes an area for user input (e.g., touchpad and keyboard). In addition, the viewable display may be a touchscreen (e.g., touchscreen laptop), allowing the user to interact directly with what is displayed by touching the screen with simple or multi-touch gestures.

BRIEF DESCRIPTION OF THE DRAWINGS

FIGS. 1A-B illustrate a computing device with shape memory material (SMM) used to adjust a clearance below a bottom surface of the computing device according to a temperature of a heat generating component, according to an example.

DETAILED DESCRIPTION

Figure 2A:
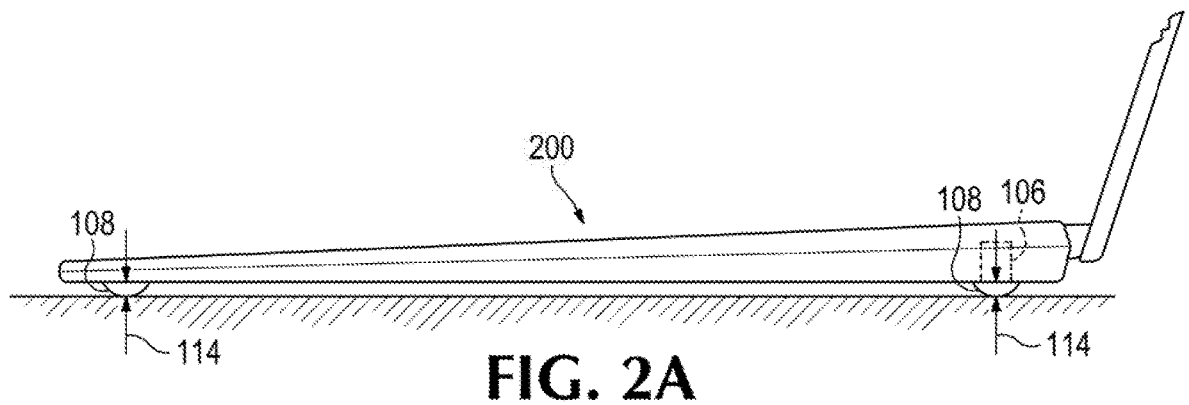
FIGS. 2A-B illustrate a notebook computer with the SMM used to adjust a clearance below a bottom surface of a base member of the notebook computer according to a temperature of the heat generating component, according to an example.

Examples disclosed herein provide a mechanism for computing devices, such as the notebook computer described above, for dynamically improving the thermal performance of the computing devices, as heat generating components, such as a central processing unit (CPU), generate heat. As an example, the mechanism for dynamically improving the thermal performance includes shape memory material (SMM) that adjusts a clearance below the bottom surface of a computing device, according to a temperature of the heat generating component. A vent along the bottom surface may be used to channel air to flow between the computing device and environment, for example, via a fan disposed within the computing device.

Adjusting the clearance below the bottom surface of the computing device according to the temperature of the CPU controls the amount of airflow below the computing device, which can provide for improved thermal performance. As an example, the improved thermal performance keeps the computing device cool, and cooler devices have the potential to have higher performance. In addition, with CPU performance increasing, the requirement for computing devices such as notebook computers to remove thermal energy is important to keep the skin temperature of the device low enough for users to be comfortable.

With reference to the figures, FIGS. 1A-B illustrate a computing device 100 with shape memory material (SMM) 106 used to adjust a clearance below a bottom surface of the computing device 100 according to a temperature of a heat generating component 102, according to an example. As an example, the computing device 100 may correspond to a desktop computer or the base member of a notebook computer, among others. The heat generating component 102, such as a CPU, may be disposed within the computing device 100, for example, coupled to a printed circuit board (PCB) 112, and the current processing load of the CPU may determine the temperature of the heat generating component 102. For example, if the current processing load of the CPU is low, the temperature of the heat generating component 102 may fall below a threshold value. However, when the processing load of the CPU is high, the temperature of the heat generating component 102 may exceed the threshold value. In addition, rather than relying on a temperature threshold value to determine the processing load of the CPU, whether the temperature of the CPU falls within a lower range or higher range may provide an indication of whether the processing load of the CPU is low or high, respectively.

A vent 104 along the bottom surface of the computing device 100 may be used to channel air to flow between the computing device 100 and environment, for example, via a fan (not illustrated) disposed within the computing device 100. As will be further described, by using the SMM 106 to adjust a clearance below the bottom surface of the computing device 100 according to the temperature of the heat generating component 102, thermal performance of the computing device 100 may be dynamically maintained.

As an example, the computing device 100 includes a higher thermal conductivity component 110, such as a heat pipe, coupling the heat generating component 102 and the SMM 106. As a result, heat generated by the heat generating component 102 may transfer to the SMM 106 via the heat pipe 110, triggering the resulting shape change of the SMM 106. For example, if the temperature of the heat generating component 102 is to fall below the threshold value (e.g., processing load of CPU is light), the length of the SMM 106 may compress or be reduced, decreasing the clearance below the bottom surface of the computing device 100. However, when the temperature of the heat generating component 102 exceeds the threshold value (e.g., processing load of CPU is high), the lower clearance may make it difficult for air to flow into the fan via the vent 104 and cool the heat generating component 102. As a result, the length of the SMM 106 may extend once the heat generated by the heat generating component 102 is transferred to the SMM 106 via the heat pipe 110, then increasing the clearance below the bottom surface of the computing device 100, allowing for more heat to be dissipated.

As an example, the SMM 106 may be coupled to feet of the computing device 100, as illustrated. In addition, the computing device 100 may include flexible material 108 to accommodate the SMM 106 and feet when it is to extend along the bottom surface of the computing device 100. As an example, the flexible material 108 may be flexible rubber that can stretch when the SMM 106 extended. As a result, the flexible material 108 contributes to the aesthetics of the computing device 100 without making a gap between the bottom surface of the computing device 100 and the feet coupled to the SMM 106.

Shape memory material have the ability to return from a deformed state (e.g., temporary shape) to their original shape (e.g., permanent) induced by an external stimulus (trigger), such as the temperature change described above. For example, the shape memory material remembers its original shape and, when deformed, returns to its pre-deformed shape when heated. In addition to temperature change, the shape change of shape memory material can also be triggered by an electric or magnetic field, light, or solution. Shape memory material is a solid-state alternative to actuators, such as hydraulic, pneumatic, and motor-based systems. As a result, by using SMM 106, electromechanical features, which can increase the cost and complexity of the computing device 100, can be avoided.

Examples of shape memory material include copper-aluminum-nickel and nickel-titanium (NiTi) alloys. However, shape memory material can be created by alloying zinc, copper, gold, and iron. In addition, non-metal shape memory materials, such as ceramic material and organic polymer shape memory material, can be used for shape memory material. As an example, NiTi based shape memory material provide stability and superior thermo-mechanic performance. NiTi alloys change from austenite to martensite upon cooling. $M_f$ is the temperature at which the transition to martensite completes upon cooling. Accordingly, during heating $A_s$ and $A_f$ are the temperatures at which the transformation from martensite to austenite starts and finishes. As a result, SMM 106 can remember two different shapes, one at low temperatures, and one at the high temperatures, as will be further described. However, additional transformations of the SMM 106 is possible, for example, to provide additional levels of clearance below the bottom surface of the computing device 100. In addition, the number of SMM 106 may vary, based on the clearance required below bottom surface of the computing device 100.

Referring to FIG. 1A, the SMM 106 is illustrated as a length x, according to an example. For example, when the temperature of the heat generating component 102 is below a threshold value or at a lower temperature like room temperature, indicating that the processing load of the CPU may be low, the length of the SMM 106 may remain at a minimum (e.g., length x), as the need for airflow below the bottom surface of the computing device 100 may be low. As a result, the clearance below the bottom surface of the computing device 100 (indicated by 114) may be low, providing a desirable look by keeping the computing device 100 closer to a surface. However, when the temperature of the heat generating component 102 exceeds the threshold value or is at a higher temperature, indicating that the processing load of the CPU may be high, the heat from the heat generating component 102 may transfer to the SMM 106 via the heat pipe 110, extending the SMM 106 by an additional y units (x+y), to increase the clearance (indicated by 116) below the bottom surface of the computing device 100, as illustrated in FIG. 1B.

The additional clearance 116 may provide additional capacity for airflow to reach the bottom surface of the computing device 100, dynamically improving the thermal performance of the computing device 100, keeping the computing device 100 at a comfortable temperature. For example, the computing device 100 may be able to dissipate more heat when the clearance below the bottom surface of the computing device 100 increases. In addition, when the feet are extended, the flexible material 108 can stretch, helping the feet maintain its preferred shape, and ensuring there are no gaps into the computing device 100 around the feet. When the temperature of the heat generating component 102 falls back below the threshold vale or to a lower temperature, the temperature of the SMM 106 correspondingly reduces, causing the SMM 106 to compress, decreasing the clearance below the bottom surface of the computing device 100 back to 114, indicated in FIG. 1A.

Figure 2B:
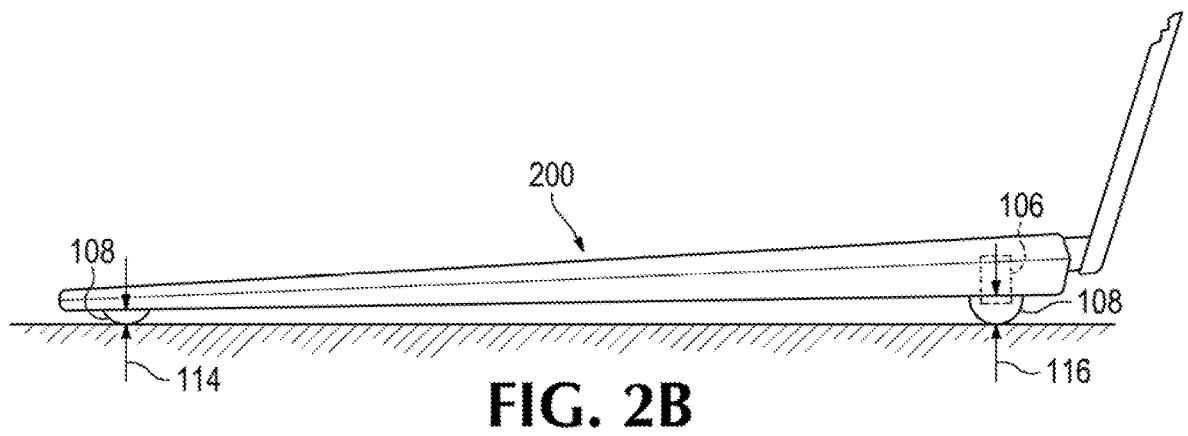

With reference to the figures, FIGS. 2A-B illustrate a computing device, such as a notebook computer, with shape memory material (SMM) 106 used to adjust a clearance below a bottom surface of a base member 200 of the computing device according to a temperature of a heat generating component, according to an example. As illustrated, the computing device includes a display member and the base member 200 rotatably connected to the display member. As described above, the heat generating component (not illustrated), such as a CPU, may be disposed within the base member 200, and the current processing load of the CPU may determine its temperature. For example, if the current processing load of the CPU is low, its temperature may fall below a threshold value. However, when the processing load of the CPU is high, its temperature may exceed the threshold value. As described above, by using the SMM 106 to adjust a clearance below the bottom surface of the base member 200 according to the temperature of the heat generating component, thermal performance of the notebook computer may be dynamically maintained.

Referring to FIG. 2A, the SMM 106 provides a clearance of 114 below the base member 200, according to an example. For example, when the temperature of the heat generating component is below a threshold value or at a lower temperature like room temperature, indicating that the processing load of the CPU may be low, the length of the SMM 106 may remain at a minimum, as the need for airflow below the bottom surface of the base member 200 may be low. As a result, the clearance below the bottom surface of the computing device 100 (indicated by 114) may be low, providing a desirable look by keeping the base member 200 of the notebook computer closer to a surface. However, when the temperature of the heat generating component exceeds the threshold value or is at a higher temperature, indicating that the processing load of the CPU may be high, the heat from the heat generating component may transfer to the SMM 106, for example, via a higher thermal conductivity component such as a heat pipe, extending the SMM 106, to increase the clearance (indicated by 116) below the bottom surface of the base member 200, as illustrated in FIG. 2B.

The additional clearance 116 may provide additional capacity for airflow to reach the bottom surface of the base member 200, dynamically improving the thermal performance of the notebook computer. For example, the base member 200 of the notebook computer may be able to dissipate more heat when the clearance below the bottom surface of the base member 200 increases. In addition, when the feet are extended, the flexible material 108 can stretch, helping the feet maintain its preferred shape, and ensuring there are no gaps into the base member 200 around the feet. FIGS. 2A-B provide the SMM 106 disposed along the rear feet of the base member 200, inclining the base member 200 at an angle when increased clearance is required to dissipate heat more efficiently (e.g., FIG. 2B). However, the SMM 106 may be disposed on another combination of the feet, such as the front feet as well, in order for the base member 200 to be uniformly raised when required.

It should be understood that examples described herein below may include various components and features. It should also be understood that, in the following description, numerous specific details are set forth to provide a thorough understanding of the examples. However, it should be understood that the examples may be practiced without limitations to these specific details. In some instances, well known methods and structures may not be described in detail to avoid unnecessarily obscuring the description of the examples. Also, the examples may be used in combination with each other.

Reference in the specification to "an example" or similar language means that a particular feature, structure, or characteristic described in connection with the example is included in at least one example, but not necessarily in other examples. The various instances of the phrase "in one example" or similar phrases in various places in the specification are not necessarily all referring to the same example.

It should be understood that the previous description of the disclosed examples is provided to enable any person skilled in the art to make or use the present disclosure. Various modifications to these examples will be readily apparent to those skilled in the art, and the generic principles defined herein may be applied to other examples without departing from the spirit or scope of the disclosure. Thus, the present disclosure is not intended to be limited to the examples shown herein but is to be accorded the widest scope consistent with the principles and novel features disclosed herein.

What is claimed is:

1. A computing device comprising:
   a display member, and
   a base member rotatably connected to the display member, wherein the base member comprises:
   a heat generating component disposed with the base member;
   a flexible material; and
   shape memory material (SMM) that is to extend into the flexible material to adjust a clearance below a bottom surface of the base member according to a temperature of the heat generating component; wherein the flexible material is to accommodate the SMM and stretch when the SMM is extended into the flexible material.

2. The computing device of claim 1, wherein when the temperature of the heat generating component is to exceed a threshold value, the SMM is to extend to increase the clearance below the bottom surface of the base member.

3. The computing device of claim 2, wherein when the temperature of the heat generating component is to fall back below the threshold value, the SMM is to compress to decrease the clearance below the bottom surface of the base member.

4. The computing device of claim 1, comprising a higher thermal conductivity component coupled to the heat generating component and the SMM.

5. The computing device of claim 4, wherein heat generated by the heat generating component is to transfer to the SMM via the higher thermal conductivity component, wherein the adjustment of the SMM corresponds to the heat transferred to the SMM.

6. The computing device of claim 1, wherein the base member comprises:
   a vent along the bottom surface of the base member, and
   a fan disposed within the base member to channel air to flow within the base member via the vent.

7. The computing device of claim 1, wherein the flexible material is rubber.

8. A computing device comprising:
   a heat generating component disposed within the computing device;
   shape memory material (SMM);
   a flexible material; and
   a higher thermal conductivity component coupled to the heat generating component and the SMM, wherein the SMM is to extend into the flexible material to adjust a clearance below a bottom surface of the computing device according to a temperature of the heat generating component wherein the flexible material is to accommodate the SMM and stretch when the SMM is extended.

9. The computing device of claim 8, wherein heat generated by the heat generating component is to transfer to the SMM via the higher thermal conductivity component, wherein the adjustment of the SMM corresponds to the heat transferred to the SMM.

10. The computing device of claim 8, wherein when the temperature of the heat generating component is to exceed a threshold value, the SMM is to extend to increase the clearance below the bottom surface of the computing device.

11. The computing device of claim 10, wherein when the temperature of the heat generating component is to fall back below the threshold value, the SMM is to compress to decrease the clearance below the bottom surface of the computing device.

12. The computing device of claim 8, wherein the flexible material is rubber.

13. A computing device comprising: a display member; and
   a base member rotatably connected to the display member, wherein the base member comprises:
   a heat generating component disposed within the base member;
   a flexible material; and
   shape memory material (SMM) that extends into the flexible material to adjust a clearance below a bottom surface of the base member according to a temperature of the heat generating component; wherein the flexible material is to accommodate the SMM and stretch when the SMM is extended.

14. The computing device of claim 13, wherein when the temperature of the heat generating component is to exceed a threshold value, the SMM is to extend to increase the clearance below the bottom surface of the base member.

15. The computing device of claim 14, wherein when the temperature of the heat generating component is to fall back below the threshold value, the SMM is to compress to decrease the clearance below the bottom surface of the base member.

16. The computing device of claim 13, wherein the flexible material is rubber.

* * * * *